(12) United States Patent
Garcia Alvarez et al.

(10) Patent No.: US 10,793,005 B2
(45) Date of Patent: Oct. 6, 2020

(54) METHOD FOR OPERATING A SAFETY DEVICE

(71) Applicant: Robert Bosch GmbH, Stuttgart (DE)

(72) Inventors: Vicente Garcia Alvarez, Stuttgart (DE); Holger Sievert, Ludwigsburg (DE); Gerd Lorenz, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/331,565

(22) PCT Filed: Aug. 8, 2017

(86) PCT No.: PCT/EP2017/069984
§ 371 (c)(1),
(2) Date: Mar. 8, 2019

(87) PCT Pub. No.: WO2018/050360
PCT Pub. Date: Mar. 22, 2018

(65) Prior Publication Data
US 2019/0210466 A1 Jul. 11, 2019

(30) Foreign Application Priority Data
Sep. 13, 2016 (DE) .................. 10 2016 217 431

(51) Int. Cl.
*B60L 3/04* (2006.01)
*H02H 1/00* (2006.01)
*G08B 17/117* (2006.01)
*G08B 17/12* (2006.01)
*H05K 7/14* (2006.01)

(52) U.S. Cl.
CPC .............. *B60L 3/04* (2013.01); *G08B 17/117* (2013.01); *G08B 17/12* (2013.01); *H02H 1/0023* (2013.01); *H05K 7/1432* (2013.01)

(58) Field of Classification Search
CPC ......................................................... B60L 3/04
See application file for complete search history.

(56) References Cited

U.S. PATENT DOCUMENTS

| 4,132,814 A | 1/1979 | De Luca et al. |
| 2013/0021155 A1* | 1/2013 | Gandara ................ G08B 29/06 340/540 |

(Continued)

FOREIGN PATENT DOCUMENTS

| CN | 1152756 A | 6/1997 |
| CN | 1860570 A | 11/2006 |

(Continued)

OTHER PUBLICATIONS

International Search Report for Application No. PCT/EP2017/069984 dated Nov. 20, 2017 (English Translation, 2 pages).

*Primary Examiner* — Qutbuddin Ghulamali
(74) *Attorney, Agent, or Firm* — Michael Best & Friedrich LLP

(57) ABSTRACT

The present invention relates to a method for operating a security device, comprising a housing with at least one current-carrying element, wherein the current-carrying element is arranged in the housing interior and is enclosed by the housing. A particle detector is arranged in the housing interior, which monitors the housing interior with respect to the formation of particles.

14 Claims, 1 Drawing Sheet

(56) References Cited

U.S. PATENT DOCUMENTS

| | | | | |
|---|---|---|---|---|
| 2014/0085093 A1* | 3/2014 | Mittleman | ............ | H04L 12/282 340/628 |
| 2014/0104067 A1* | 4/2014 | Chien | .................... | G08B 17/10 340/628 |
| 2014/0125487 A1* | 5/2014 | Polak | .................... | G08B 17/10 340/628 |
| 2015/0022351 A1* | 1/2015 | Gettings | ................ | G01N 21/84 340/540 |
| 2016/0116389 A1* | 4/2016 | Cooper | ................ | G08B 29/183 356/340 |
| 2018/0350220 A1* | 12/2018 | Gonzales | ............. | G08B 17/117 |
| 2019/0172333 A1* | 6/2019 | Combe | ................ | G08B 17/117 |

FOREIGN PATENT DOCUMENTS

| | | | |
|---|---|---|---|
| CN | 101755374 | A | 6/2010 |
| CN | 102956665 | A | 3/2013 |
| CN | 103018145 | A | 4/2013 |
| DE | 202005011504 | | 11/2006 |
| JP | 08043305 | A | 2/1996 |
| JP | 3175434 | B2 | 6/2001 |
| JP | 2001307834 | A | 11/2001 |
| JP | 2003315268 | A | 11/2003 |
| JP | 2004198121 | A | 7/2004 |
| JP | 2013105660 | A | 5/2013 |
| JP | 2013542441 | A | 11/2013 |
| WO | 2014194379 | | 12/2014 |

\* cited by examiner

METHOD FOR OPERATING A SAFETY DEVICE

BACKGROUND OF THE INVENTION

The present invention relates to a method for operating a safety device.

Electrical vehicles and hybrid vehicles conventionally have an electrical motor, which delivers all or a part of the drive power. In hybrid vehicles, a part of the drive power is generated by an electrical motor, and in electrical vehicles all of the drive power is generated by an electrical motor. The electrical energy must be converted by means of power electronics to the voltage and frequency suitable for the electrical drive motor. To this end, high-power choppers and inverters are used, which in hybrid vehicles also process the energy during generator operation of the motor for temporary storage in accumulators or double-layer capacitors. The components at high voltage are often arranged in the smallest area in the respective housing in order to save space. The consequence of this is that, because of small distances or metal shards or other possible conductive contamination, an arc discharge or arcing fault may occur.

Thus, for example in high-voltage DC applications, for example the electrical drivetrain of a hybrid motor vehicle, in order to avoid short circuits and arc discharges in the apparatus, it is necessary to comply with minimum distances for air paths and creepage paths according to the voltages occurring during operation, the degree of contamination to be taken into account, the homogeneity of the electrical field distribution for basic and functional insulation. One premise for establishing these minimum distances is that no conductive particles, which exceed a size defined in the safety margins of the air and creepage distances, occur or are introduced during assembly of the apparatus and adhere to components installed in the apparatus. The suppliers of the apparatus components, however, can disadvantageously ensure the maximum size of introduced or adhering particles (so-called flitter) only with a finite probability. An arc discharge may also occur as a result of moisture and unintended condensation. An arcing fault or accidental arc is a technically undesirably occurring arc discharge between electrical system parts in electrical power engineering. In the event of insufficient distance or insufficient insulation between two electrical potentials, an undesired voltage flashover may occur, in the course of which an arc discharge is formed. The voltage flashover may also occur in an electrical component itself, because the contacts separate too slowly or the insulation layer between the current-carrying parts has been deprived of its insulating capability.

The arc discharges which occur during voltage flashover generally reduce the lifetime of the component very significantly, and in the worst case may even destroy it. Arc discharges are a considerable risk of components at high voltage. Because of the high arc-discharge power and high temperature of the arc discharge, besides the strong light effect, a loud noise also occurs and combustible objects in the immediate vicinity may catch fire. There is a fire risk. In the low-voltage range, arcing faults may occur because of defects in the electrical lines, usually line damage, for example damaged insulation due to line constrictions or insufficient radii of curvature in electrical lines. In this case, creepage currents may occur because of contamination and deposits, which ignite in an arcing fault. Arcing faults may also occur in the case of loose contacts in incorrectly mounted components or because of kinked lines, for example through ionized gases between the loose line ends.

On printed circuit boards, particularly often in switched-mode power supplies, flashovers cause considerable damage because the conductor material (copper) becomes deposited on the printed circuit board material as a metal vapor layer and bridges creepage paths. If it is not possible to replace the entire module, such damage is remedied by slits in the circuit board; the new creepage path consists of an air gap. Precautionary measures used are soldering eyelets with hollow rivets, thicker copper layers, wire-reinforced conductor tracks, a chambered housing and overdimensioned creepage paths. This is in conflict with miniaturization because of the small installation space, for example in hybrid and electrical vehicles. It is therefore imperative to avoid arc discharges or, in the event that an arc discharge formation takes place, to quench them rapidly.

With respect to the occurrence of arc discharges in high-voltage DC applications, for example the electrical drive train of a hybrid motor vehicle, for arc discharge detection the connected apparatuses such as drive inverters and DC/DC converters need to be monitored with suitable sensors. In response to a detected arc discharge, the high-voltage supply of the apparatus affected by the arcing fault/arc discharge must be switched off before the energy developed in the arc discharge becomes so great that the arc discharge jumps over onto the apparatus housing or emerges from the apparatus, and therefore causes a fire incident. When an arcing fault occurs, detrimentally conductive particles (for example carbonized insulating materials, soot, plasma, vaporized metallic conductive materials, etc.) are formed in an apparatus in the time range of microseconds. By the thermal and electromagnetic effect of the arcing fault, these particles become distributed explosively inside the apparatus in question. These particles are considered to be a cause of the ignition of secondary arcing faults inside an affected apparatus. Various methods are proposed in the prior art as sensors for detecting an arc discharge. On the one hand, evaluation of the pressure increase due to the thermal effect of an arcing fault inside an enclosed apparatus volume is carried out. On the other hand, the radiation (in the visible and invisible ranges) emitted by an arcing fault in the apparatus is evaluated (see DE 20 2005 011 504 U1). Furthermore, the acoustic effect when an arcing fault occurs is evaluated, or the energy developed in an apparatus (source/sink comparison) is calculated. As an alternative, the high-frequency spectrum generated by an arc discharge is evaluated. Some of the aforementioned methods are disadvantageous because of the outlay required therefor on sensors and the calculation power required for the detection, or are greatly restricted because of the susceptibility to interference in high-voltage DC applications. Some of the methods have restrictions insofar as a plurality of detection instruments are required in apparatuses with a subdivided housing in order to comply with a detection time required in order to limit the arc discharge energy. Validation and correlation of a plurality of individual sensors entail additional calculation outlay and packaging.

There is therefore a need for a method by which the ignition of secondary arc discharges in the housing is effectively prevented.

SUMMARY OF THE INVENTION

The method according to the invention has the advantages that the occurrence of secondary arc discharges is prevented.

To this end, according to the invention, a method for operating a safety device is provided, the safety device comprising a housing with at least one current-carrying element, the current-carrying element being arranged in the housing interior and enclosed by the housing. A particle detector, which monitors the housing interior for the occurrence of particles, is arranged in the housing interior of the housing. Advantageously, the particle detector detects the particles occurring during an arc discharge as soon as they have spread out from the occurrence site (the primary arc discharge) in the entire apparatus. If particles in the housing are detected by the particle detector, the high-voltage supply of the apparatus may advantageously be switched off, so that a possibly occurring fire event can be averted.

Advantageously, the particle detector is a photoelectric barrier. A photoelectric barrier in optoelectronics is a system which detects the breaking of a light beam and displays this as an electrical signal. Advantageously, moving objects, for example particles, can be detected contactlessly by means of the photoelectric barrier.

It is furthermore advantageous for the particle detector to have a radiation source (emitter) and the radiation receiver (receiver). A functional test of the photoelectric barrier (with a detection path lying between radiation source and a radiation receiver) is advantageously possible at any time simply by means of the two photoelectric barrier components: emitter and receiver.

A light-emitting diode or a laser diode is advantageously used as the radiation source. Suitable light-emitting diodes are, for example, those with a wavelength of 660 nm (visible red light) or infrared LEDs with 880-940 nm in the infrared range. Infrared light has the advantage of achieving a higher range on dark materials, and is also invisible to the human eye. The advantage of red light consists in the simpler adjustment of the sensor system using the visible light spot. For particularly precise applications (small part detection, high repetition accuracy), light from a laser diode is generally used.

A photoresistor, a photodiode or a phototransistor is preferably used as the radiation receiver.

The more light strikes the photoresistor, the smaller its electrical resistance becomes, so that the detection of particles is possible. In comparison with other light sensors, however, photoresistors respond rather slowly. Photodiodes, on the other hand, are used inter alia in order to convert light into an electrical voltage or an electrical current, or in order to receive information transmitted using light. If particles enter the light path of the photoelectric barrier, correspondingly less light strikes the receiver, so that a low electrical voltage is registered and the presence of particles in the housing can therefore be deduced.

Phototransistors are advantageously substantially more sensitive than photodiodes, since they simultaneously act as an amplifier.

The safety device advantageously monitors the radiation receiver for radiation emitted by an arc discharge. When it occurs, an arc discharge has a high-frequency spectrum which can be received by means of the radiation receiver and subsequently evaluated. By means of the photoelectric barrier, it is therefore possible not only to detect particles and therefore avoid the occurrence of secondary arc discharges, but also in general to detect the occurrence of arc discharges.

It is additionally advantageous to arrange the photoelectric barrier on or in an opening of the housing. As an alternative, the photoelectric barrier is installed between divisions or partitions inside the apparatus. The pressure increase at the occurrence site, associated with the occurrence of an arc discharge, leads to a temporary pressure difference between the occurrence site and the rest of the housing, so that particles are forcibly transported through the openings which are present, or the housing opening, and can therefore be detected reliably at this position—at which the photoelectric barrier is advantageously arranged.

Since it is rather undesirable for the particles generated by the arcing fault to emerge from the apparatus housing, additional apparatus openings on the outside of the apparatus should not be provided for the particle detection. Correspondingly, the pressure equalization opening (PEO) usually present in the apparatuses is used as openings for the method according to the invention.

Further features and advantages of the present invention will be apparent to the person skilled in the art from the following description of exemplary embodiments, which are not however to be interpreted as restricting the invention, with reference to the appended drawings.

DETAILED DESCRIPTION

All the figures are merely schematic representations of the method according to the invention, or its components, according to exemplary embodiments of the invention. In particular, distances and size relationships are not reproduced true-to-scale in the figures. In the various figures, corresponding elements are provided with the same reference numbers.

Figure 1:
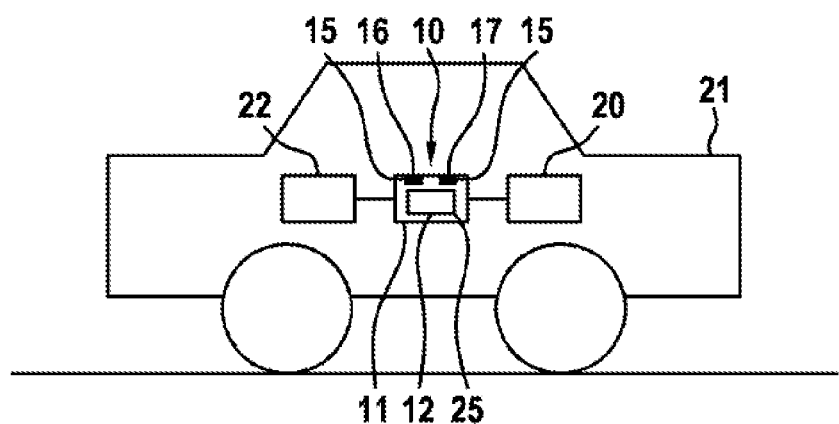
FIG. 1: shows a schematic representation of a vehicle and of the safety device.

FIG. 1 shows a schematic representation of a vehicle 21 having a safety device 10. The safety device 10 comprises a housing 11. This housing 11 has a housing interior 13, in which a current-carrying element 12 is arranged. The current-carrying element 12 may involve any desired electronic components/elements (for example power electronics 23, DC/DC converter 23, etc.) which are enclosed by the housing 11, or are located in the housing 11. The safety device 10 is connected to a battery 22 and an electrical motor 20, and may be part of a charging device 25 (not represented here).

Figure 2:
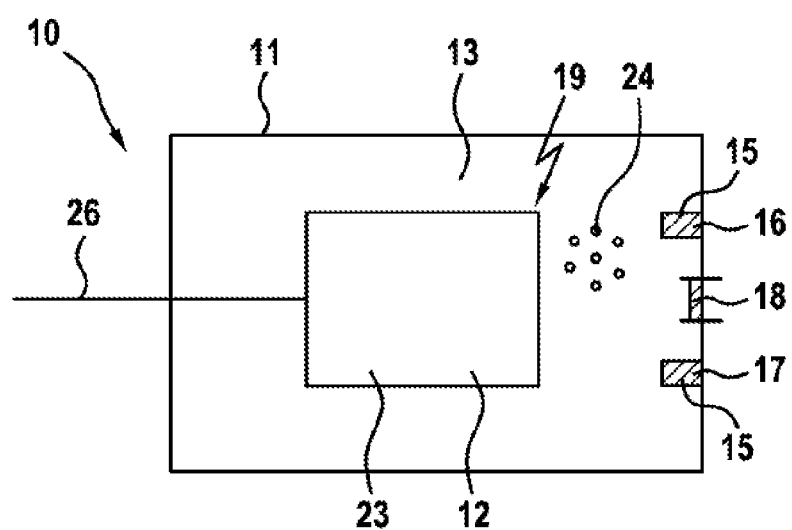
FIG. 2: shows a schematic representation of a safety device.

FIG. 2 shows a schematic representation of a safety device 10. Elements which are the same as in FIG. 1 are provided with the same references and will not be explained in detail. The safety device 10 comprises a housing 11, in the housing interior 13 of which a current-carrying element 12 (power electronics 23, a DC/DC converter 23, etc.) is arranged. The housing 11 may have divisions or partitions inside the housing 11. A particle detector 15 is arranged in the housing interior 13. The particle detector 15 is configured as a photoelectric barrier, and consists of a radiation source 16 (emitter) and a radiation receiver 17 (receiver). A light-emitting diode or a laser diode is advantageously used as the radiation source 16. A photoresistor, a photodiode or a phototransistor is preferably used as the radiation receiver 17. The radiation source 16 emits an electromagnetic beam, which is directed at the radiation receiver 17. If particles 24 pass between the radiation receiver 17 and the radiation source 16, they are registered by the photoelectric barrier 15, which leads to the safety device 10 switching off the voltage supply 26 of the current-carrying element 12. Furthermore, the safety device 10 monitors the radiation receiver 17 for the radiation emitted by an arc discharge 19. If an arc discharge 19 occurs, the radiation then occurring is registered by the radiation receiver 17 in addition to the light emitted by the radiation source 16. The radiation of the arc discharge 19 has a typical high-frequency spectrum, which indicates the occurrence of an arc discharge 19. The safety device 10 can therefore already switch off the voltage supply 26 before any particles 24 have actually been detected by the photoelectric barrier 15. The particle detector 15 is fitted at or in an opening 18 of the housing 11. If an arc discharge 19 occurs, the air around the arc discharge becomes abruptly heated, so that a pressure increase takes place at the occurrence site of the arc discharge 19. The temporary pressure difference between the occurrence site and the rest of the housing 11 leads to the particles 24 being forcibly transported through housing openings which are present, for example the opening 18. Correspondingly, the particles are reliably detected by the particle detector 15 when they pass through the opening 18. For example, the pressure equalization opening present in the housing 11 is used as the opening 18.

The invention claimed is:

1. A method for operating a safety device (10), the safety device (10) including a housing (11) with at least one current-carrying element (12) connected to a power supply (26), the current-carrying element (12) being arranged in a housing interior (13) and enclosed by the housing (11), and a particle detector (15) configured as a photoelectric barrier and includes a radiation source (16) and a radiation receiver (17) and is arranged within the housing interior (13) of the housing, the method comprising:

monitoring, via the particle detector (15), for an occurrence of an arc discharge (19) by monitoring the housing interior (13) for conductive particles (24) resulting from the arc discharge and for radiation emitted from the arc discharge (19); and switching off the power supply (26) in response to detecting, via the radiation receiver (17) the occurrence of the arc discharge upon detecting the radiation or conductive particles (24), wherein the safety device (10) is configured to switch off the power supply (26) upon detecting the radiation emitted by the arc discharge (19), via the radiation receiver (17), before the particles (24) have been detected by the photoelectric barrier.

2. The method for operating a safety device (10) as claimed in claim 1, wherein the radiation source (16) comprises a light-emitting diode.

3. The method for operating a safety device (10) as claimed in claim 1, wherein the radiation receiver (17) comprises a photodiode.

4. The method for operating a safety device (10) as claimed in claim 1, wherein the particle detector (15) is arranged on or in an opening (18) of the housing (11).

5. The method for operating a safety device (10) as claimed in claim 4, wherein the opening (18) is a pressure equalization opening of the housing (11).

6. The method for operating a safety device (10) as claimed in claim 1, wherein the radiation source (16) is a laser diode.

7. The method for operating a safety device (10) as claimed in claim 1, wherein the radiation receiver (17) comprises a phototransistor.

8. The method for operating a safety device (10) as claimed in claim 1, wherein the radiation receiver (17) comprises a photoresistor.

9. A safety device comprising:

a housing (11);

at least one current-carrying element (12) connected to a power supply (26) and arranged in a housing interior (13) and enclosed by the housing (11); and a particle detector (15) configured as a photoelectric barrier and includes a radiation source (16) and a radiation receiver (17) and is arranged within the housing interior (13) of the housing, the particle detector configured to monitor the housing interior (13) for an occurrence of an arc discharge (19) by monitoring the housing interior (13) for conductive particles (24) and for radiation emitted from the an arc discharge (19), wherein the safety device (10) is configured to switch off the power supply (26) upon detecting the radiation emitted by the arc discharge (19), via the radiation receiver (17), before the conductive particles (24) have been detected by the photoelectric barrier.

10. The safety device (10) as claimed in claim 9, wherein the radiation source (16) comprises a light-emitting diode.

11. The safety device (10) as claimed in claim 9, wherein the radiation receiver (17) comprises a photodiode.

12. The safety device (10) as claimed in claim 9, wherein the particle detector (15) is arranged on an opening (18) of the housing (11).

13. The safety device (10) as claimed in claim 12, wherein the opening (18) comprises a pressure equalization opening of the housing (11).

14. The safety device (10) as claimed in claim 9, wherein the radiation source (16) is a laser diode.

\* \* \* \* \*